US009064797B2

(12) United States Patent
Tsai et al.

(10) Patent No.: US 9,064,797 B2
(45) Date of Patent: Jun. 23, 2015

(54) SYSTEMS AND METHODS FOR DOPANT ACTIVATION USING PRE-AMORPHIZATION IMPLANTATION AND MICROWAVE RADIATION

(71) Applicant: Taiwan Semiconductor Manufacturing Company Limited, Hsinchu (TW)

(72) Inventors: Chun-Hsiung Tsai, Hsinchu County (TW); Chen-Feng Hsu, Hsinchu (TW); Yi-Tang Lin, Hsinchu (TW); Clement Hsingjen Wann, New York, NY (US)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 72 days.

(21) Appl. No.: 13/973,015

(22) Filed: Aug. 22, 2013

(65) Prior Publication Data

US 2015/0053983 A1  Feb. 26, 2015

(51) Int. Cl.
*H01L 21/265* (2006.01)
*H01L 29/16* (2006.01)

(52) U.S. Cl.
CPC ...... *H01L 21/26513* (2013.01); *H01L 29/1604* (2013.01)

(58) Field of Classification Search
CPC .............. H01L 21/26513; H01L 29/1604; H01L 2924/20271
USPC .................. 438/766, 771, 777, 934
See application file for complete search history.

(56) References Cited

U.S. PATENT DOCUMENTS

| | | | | |
|---|---|---|---|---|
| 7,928,021 | B2* | 4/2011 | Kowalski et al. | 438/795 |
| 8,377,732 | B2* | 2/2013 | Oshiki et al. | 438/69 |
| 2002/0187614 | A1* | 12/2002 | Downey | 438/407 |
| 2003/0186519 | A1* | 10/2003 | Downey et al. | 438/530 |
| 2009/0184399 | A1* | 7/2009 | Kowalski et al. | 257/618 |
| 2011/0159634 | A1* | 6/2011 | Oshiki et al. | 438/73 |
| 2013/0023104 | A1* | 1/2013 | Isogai | 438/306 |
| 2013/0285129 | A1* | 10/2013 | Jensen et al. | 257/288 |
| 2013/0288438 | A1* | 10/2013 | Jensen et al. | 438/197 |

OTHER PUBLICATIONS

Al-Bayati et al., Exploring the Limits of Pre-Amorphization Implants on Controlling Channeling and Diffusion of Low Energy B Implants and Ultra Shallow Junction Formation, IEEE, 2000, pp. 54-57.*
Rao et al., Microwave annealing enhances Al-induced lateral crystallization of amorphous silicon thin films, Journal of Crystal Growth, 273, 2004, pp. 68-74.*

(Continued)

*Primary Examiner* — Earl Taylor
(74) *Attorney, Agent, or Firm* — Jones Day

(57) ABSTRACT

Systems and methods are provided for dopant activation in a semiconductor structure for fabricating semiconductor devices. For example, a substrate is provided. A semiconductor structure is formed on the substrate. Pre-amorphization implantation is performed on the semiconductor structure. Microwave radiation is applied to the semiconductor structure to activate dopants in the semiconductor structure for fabricating semiconductor devices. Microwave-radiation absorption of the semiconductor structure is increased after the pre-amorphization implantation.

19 Claims, 2 Drawing Sheets

(56) References Cited

OTHER PUBLICATIONS

Ahn et al., Microwave-induced low-temperature crystallization of amorphous Si thin films, Current Applied Physics, 2, 2002, pp. 135-139.*

Xu et al., Formation of ultra-shallow junctions with pre-amorphization implant and microwave annealing, Ext. Abs. The 13th International Workshop on Junction Technology, Jun. 2013, pp. 91-93.*

* cited by examiner

SYSTEMS AND METHODS FOR DOPANT ACTIVATION USING PRE-AMORPHIZATION IMPLANTATION AND MICROWAVE RADIATION

FIELD

The technology described in this patent document relates generally to semiconductor materials and more particularly to processing of semiconductor materials.

BACKGROUND

Modern semiconductor devices are often fabricated through many processes. As an example, fabricating a field effect transistor usually involves doping a semiconductor substrate (e.g., adding desired impurities into the substrate) to form source/drain junctions. Many different approaches may be implemented for doping the substrate, such as ion implantation and epitaxial growth. The dopants introduced into the substrate are usually electrically activated before semiconductor devices can be fabricated on the substrate. The activation of the dopants often includes transferring the dopant atoms/molecules from interstitial positions into lattice sites of the lattice structure of the substrate. Different annealing techniques may be used for dopant activation, such as low-temperature annealing, rapid thermal annealing (RTA), millisecond thermal annealing (MSA), spike annealing, and laser thermal annealing.

Under certain circumstances, the fabrication process of semiconductor devices involves microwave radiation which typically includes electromagnetic waves with wavelengths ranging from 1 m to 1 mm (corresponding to frequencies between 0.3 and 300 GHz). When microwave radiation is applied to a certain material (e.g., a dielectric material) which includes electric dipoles, the dipoles change their orientations in response to the changing electric fields of the microwave radiation and thus the material may absorb the microwave radiation to generate heat. The response of the material to the electric field of the microwave radiation can be measured using a complex permittivity, $\in(\Omega)^*$, which depends on the frequency of the electric field:

$$\in(\Omega)^* = \in(\Omega)' - i\in(\Omega)'' = \in_0(\in_r(\Omega)' - i\in_r(\Omega)'') \qquad (1)$$

where $\Omega$ represents the frequency of the electric field, $\in(\Omega)'$ represents a real component of the complex permittivity (i.e., a dielectric constant), and $\in(\Omega)''$ represents a dielectric loss factor. In addition, $\in_0$ represents the permittivity of a vacuum, $\in_r(\Omega)'$ represents the relative dielectric constant, and $\in_r(\Omega)''$ represents the relative dielectric loss factor.

Whether a material can absorb the microwave radiation can be characterized using a loss tangent, $\tan \delta$:

$$\tan \delta = \frac{\varepsilon'' \mu' - \varepsilon' \mu''}{\varepsilon' \mu' + \varepsilon'' \mu''} \qquad (2)$$

where $\mu'$ represents a real component of the magnetic permeability of the material, and $\mu''$ represents a magnetic loss factor. Assuming negligible magnetic loss (i.e., $\mu''=0$), the loss tangent of a material is expressed as follows:

$$\tan \delta = \frac{\varepsilon''}{\varepsilon'} = \frac{\varepsilon_r''}{\varepsilon_r'} \qquad (3)$$

Materials with a low loss tangent (e.g., $\tan \delta < 0.01$) allow microwaves to pass through with very little absorption. Materials with an extremely high loss tangent (e.g., $\tan \delta > 10$) reflect microwaves with little absorption. Materials with an intermediate loss tangent (e.g., $10 \geq \tan \delta \geq 0.01$) can absorb microwave radiation.

SUMMARY

In accordance with the teachings described herein, systems and methods are provided for dopant activation in a semiconductor structure for fabricating semiconductor devices. For example, a substrate is provided. A semiconductor structure is formed on the substrate. Pre-amorphization implantation is performed on the semiconductor structure. Microwave radiation is applied to the semiconductor structure to activate dopants in the semiconductor structure for fabricating semiconductor devices. Microwave-radiation absorption of the semiconductor structure is increased after the pre-amorphization implantation.

In one embodiment, an article for fabricating semiconductor devices includes a substrate, a semiconductor structure formed on the substrate, and a pre-amorphization layer formed on the semiconductor structure through pre-amorphization implantation. Microwave-radiation absorption of the semiconductor structure being increased after the pre-amorphization implantation. Dopants in the semiconductor structure are activated by applying microwave radiation to the semiconductor structure for fabricating semiconductor devices.

DETAILED DESCRIPTION

The conventional technology for dopant activation often involves high processing temperatures. For example, RTA is usually performed at a temperature higher than 950° C., and MSA at a temperature higher than 1050° C. Such high processing temperatures may not be suitable for some modern semiconductor devices.

Microwave radiation may be implemented for dopant activation without requiring a high processing temperature. However, certain semiconductor structures may have low microwave radiation absorption, and thus effective dopant activation may not be easy to achieve using microwave radiation. For example, an epitaxially-grown junction may have a small number of defects which often leads to insufficient dipole formation within the junction to interact with the microwave radiation for dopant activation. Pre-amorphization implantation (PAI) may be performed on a semiconductor structure (e.g., an epitaxially-grown junction) to increase microwave-radiation absorption of the semiconductor structure for dopant activation using microwave radiation.

Figure 1A:
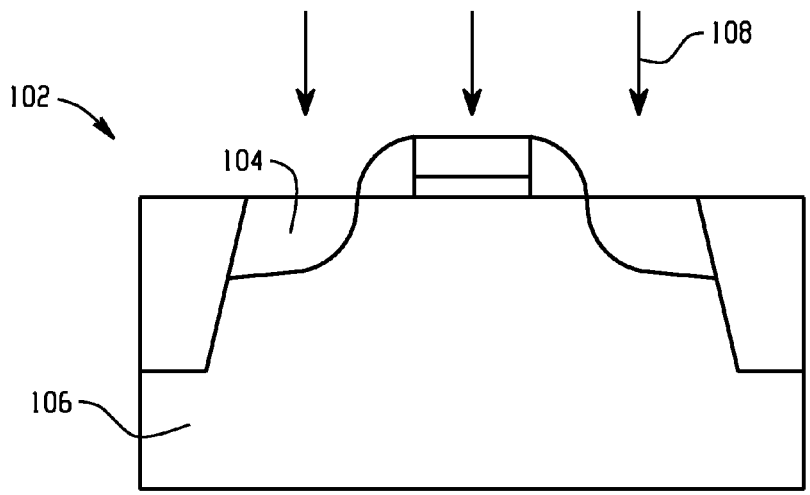
FIG. 1A-FIG. 1C depict example diagrams for dopant activation of a semiconductor structure using pre-amorphization implantation and microwave-radiation annealing.
Figure 1B:
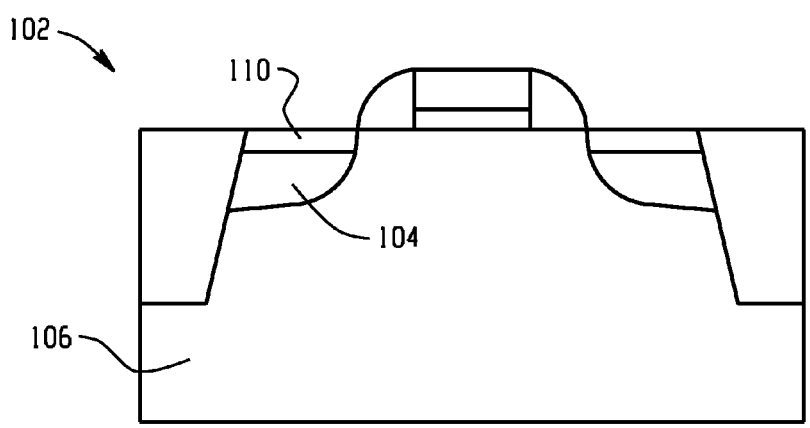
Figure 1C:
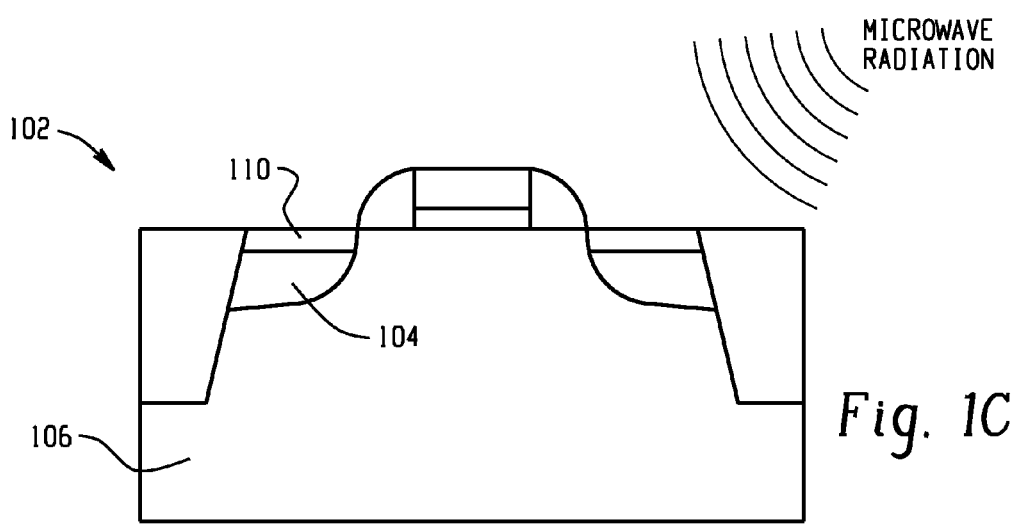

FIG. 1A-FIG. 1C depict example diagrams for dopant activation of a semiconductor structure using pre-amorphization implantation and microwave-radiation annealing. As shown in FIG. 1A, the semiconductor structure 102 may be formed on a substrate 106 and include one or more regions to be doped for fabrication of semiconductor devices. For example, a region 104 corresponds to a source/drain region of a transistor.

Before dopants are introduced into the semiconductor structure 102 (e.g., into the region 104), PAI may be performed, e.g., using a plasma doping technique, to inject certain implantation species 108 (e.g., ions) into the semiconductor structure 102 (e.g., into the region 104). In response, a pre-amorphization layer 110 may be formed in the semiconductor structure 102 (e.g., in the region 104), as shown in FIG. 1B. For example, the pre-amorphization layer 110 may contain a large amount of defects as a result of the implantation. As an example, the pre-amorphization layer 110 includes an amorphous layer of a thickness in a range of about 5 nm to about 15 nm.

In one embodiment, the PAI may be performed across the entire wafer. In another embodiment, the PAI may be performed over a portion of the wafer by using lithography to mask device regions under which the PAI may not be desired. As an example, the implantation species 108 may include boron-based materials (e.g., $B_2H_6$), silicon-based materials, phosphorous-based materials, arsenic-based materials, antinomy-based materials, germanium-based materials, helium, xenon, argon, or a combination thereof. For example, the semiconductor structure 102 may be formed at an elevated temperature by epitaxial growth, for example, through chemical vapor deposition (CVD).

In some embodiments, a dielectric layer (e.g., an oxide layer) may be formed (e.g., through thermal growth or deposition) on the semiconductor structure 102 before the PAI is performed. The dielectric layer may serve to protect the surface of the semiconductor structure 102 to prevent excess implant damage, and/or serve to prevent the implant species 108 from scattering in a horizontal direction.

After the PAI process, dopants may be introduced into the semiconductor structure 102 (e.g., into the region 104), e.g., through implantation or epitaxial growth. Then, microwave radiation may be used to anneal the semiconductor structure 102 (e.g., the region 104) for dopant activation, as shown in FIG. 1C. For example, the semiconductor structure 102 (e.g., the region 104) may undergo solid-phase epitaxial re-growth in response to the microwave radiation. The microwave-radiation absorption of the semiconductor structure 102 may be increased because of the large amount of defects generated during the PAI process. More dipoles related to the dopants may be formed in the semiconductor structure 102 (e.g., in the region 104), and these dipoles may vibrate and/or rotate in response to the applied microwave radiation. The dipole formation and the dipole motions (e.g., vibration and/or rotation) may eventually break down the bonds between the dopants and the interstitial sites in the semiconductor structure 102 (e.g., in the region 104), so that the dopants may be activated.

For example, the loss tangent of the semiconductor structure 102 may be in a range of about 0.5 to about 2. As an example, the dopants may include phosphorous, phosphorous-based molecules (e.g., SiP, SiCP), germanium, germanium-based molecules (e.g., GeB, GeSnB, SiGeB), helium, boron, boron-based molecules, or a combination thereof. The dopant concentration may be in a range from about $7\times10^{20}/cm^3$ to $5\times10^{21}/cm^3$. In one embodiment, the microwave radiation applied to the semiconductor structure 102 may have a frequency in the range of about 2 GHz to about 10 GHz. The semiconductor structure 102 may be pre-heated to a temperature in a range of 300° C. to 600° C. for the microwave-radiation annealing. The microwave radiation may be applied to the semiconductor structure 102 for a time period within a range of about 40 seconds to about 600 seconds.

A conductive layer (e.g., a metal silicide layer) may be formed (e.g., through evaporation, sputtering, deposition) on the region 104, after the microwave-radiation annealing. Contacts for a semiconductor device (e.g., a transistor) may be formed based at least in part on the conductive layer, e.g., through rapid thermal processing or microwave radiation annealing. The elements, the dosage and/or the energy of the implantation species 108 may be adjusted to reduce the contact resistivity. For example, adding phosphorus-based materials to the implantation species 108 may reduce the contact resistivity associated with a N-channel transistor formed in the semiconductor structure 102.

Figure 2:
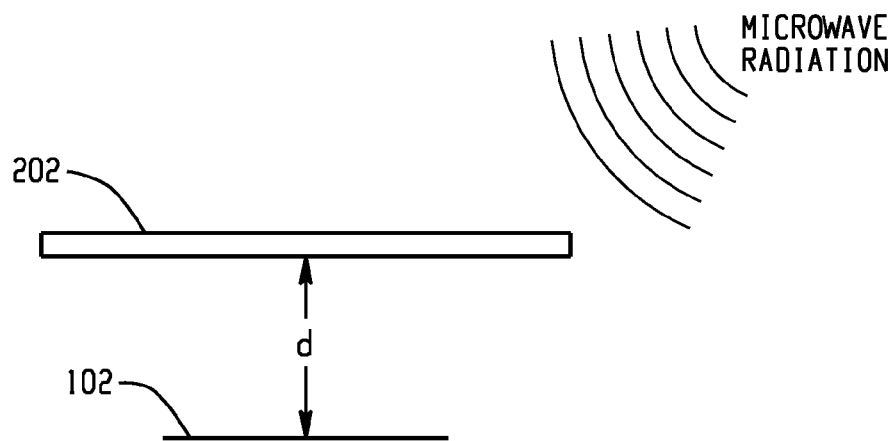
FIG. 2 depicts an example diagram for dopant activation using microwave radiation.

FIG. 2 depicts an example diagram for dopant activation using microwave radiation. An microwave-absorption material 202 is placed at a distance (e.g., d) from the semiconductor structure 102 which includes dopants, where microwave radiation may be applied to both the microwave-absorption material 202 and the semiconductor structure 102 in order to activate the dopants in the semiconductor structure 102.

The microwave-absorption material 202 which has a large loss tangent may absorb sufficient microwave radiation and increase an electric field density over the semiconductor structure 102. At the raised electric field density, more and more dipoles related to the dopants may be formed in the semiconductor structure 102, and these dipoles may vibrate and/or rotate in response to the applied microwave radiation. Once the electric field density over the semiconductor structure 102 exceeds a threshold, the dipole formation and the dipole motions (e.g., vibration and/or rotation) may break down the bonds between the dopants and the interstitial sites in the semiconductor structure 102 to activate the dopants. The distance between the microwave-absorption material 202 and the semiconductor structure 102 may be adjusted to improve the dopant activation.

For example, the microwave-absorption material 202 may include boron-doped silicon germanium, silicon phosphide, titanium, nickel, silicon nitride, silicon dioxide, silicon carbide, or a combination thereof. The microwave-absorption material 202 may have a much larger size than the semiconductor structure 102 so that the electric field density may be approximately uniform over the semiconductor structure 102.

In some embodiments, the semiconductor structure 102 may be placed between two microwave-absorption materials, where each microwave-absorption material is at a predetermined distance from the semiconductor structure 102. In certain embodiments, a microwave-absorption layer may be formed on the semiconductor structure 102, e.g., through epitaxial growth. The thickness of the microwave-absorption layer may be adjusted to improve the dopant activation. In one embodiment, multiple (e.g., two) microwave-absorption layers may be formed on different surfaces of the semiconductor structure 102.

Figure 3:
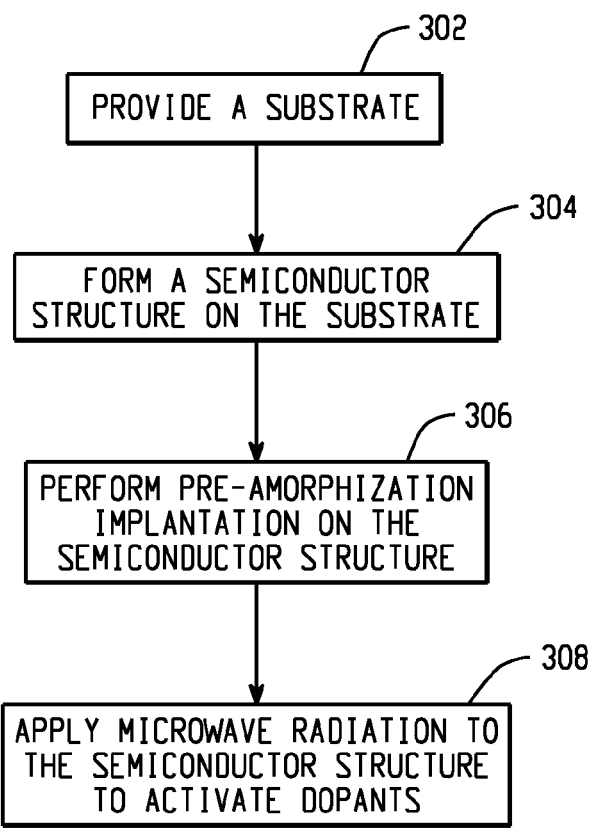
FIG. 3 depicts an example flow chart for dopant activation of a semiconductor structure using pre-amorphization implantation and microwave-radiation annealing.

FIG. 3 depicts an example flow chart for dopant activation of a semiconductor structure using pre-amorphization implantation and microwave-radiation annealing. At 302, a substrate may be provided. At 304, a semiconductor structure may be formed on the substrate. At 306, pre-amorphization implantation may be performed on the semiconductor structure. At 308, microwave radiation may be applied to the semiconductor structure to activate dopants in the semiconductor structure for fabricating semiconductor devices. Microwave-radiation absorption of the semiconductor structure is increased after the pre-amorphization implantation.

This written description uses examples to disclose the invention, include the best mode, and also to enable a person skilled in the art to make and use the invention. The patentable scope of the invention may include other examples that occur to those skilled in the art. One skilled in the relevant art will recognize that the various embodiments may be practiced without one or more of the specific details, or with other replacement and/or additional methods, materials, or components. Well-known structures, materials, or operations may not be shown or described in detail to avoid obscuring aspects of various embodiments of the invention. Various embodiments shown in the figures are illustrative example representations and are not necessarily drawn to scale. Particular features, structures, materials, or characteristics may be combined in any suitable manner in one or more embodiments. Various additional layers and/or structures may be included and/or described features may be omitted in other embodiments. For example, a particular layer described herein may include multiple components which are not necessarily connected physically or electrically. Various operations may be described as multiple discrete operations in turn, in a manner that is most helpful in understanding the invention. However, the order of description should not be construed as to imply that these operations are necessarily order dependent. In particular, these operations need not be performed in the order of presentation. Operations described herein may be performed in a different order, in series or in parallel, than the described embodiment. Various additional operations may be performed and/or described. Operations may be omitted in additional embodiments.

This written description and the following claims may include terms, such as left, right, top, bottom, over, under, upper, lower, first, second, etc. that are used for descriptive purposes only and are not to be construed as limiting. For example, terms designating relative vertical position may refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and may still fall within the meaning of the term "top." The term "on" as used herein (including in the claims) may not indicate that a first layer "on" a second layer is directly on and in immediate contact with the second layer unless such is specifically stated; there may be a third layer or other structure between the first layer and the second layer on the first layer. The term "under" as used herein (including in the claims) may not indicate that a first layer "under" a second layer is directly under and in immediate contact with the second layer unless such is specifically stated; there may be a third layer or other structure between the first layer and the second layer under the first layer. The term "substrate" may refer to any construction comprising one or more semiconductive materials, including, but not limited to, bulk semiconductive materials such as a semiconductive wafer (either alone or in assemblies comprising other materials thereon), and semiconductive material layers (either alone or in assemblies comprising other materials). The embodiments of a device or article described herein can be manufactured, used, or shipped in a number of positions and orientations. Persons skilled in the art will recognize various equivalent combinations and substitutions for various components shown in the figures.

What is claimed is:

1. A method for dopant activation in a semiconductor structure for fabricating semiconductor devices, the method comprising:
    providing a substrate;
    forming a semiconductor structure on the substrate;
    performing pre-amorphization implantation on the semiconductor structure;
    providing one or more microwave-absorption materials capable of increasing an electric field density associated with the semiconductor structure; and
    applying microwave radiation to the semiconductor structure and the microwave-absorption materials to activate dopants in the semiconductor structure for fabricating semiconductor devices;
    wherein the microwave-absorption materials are configured to increase the electric field density in response to the microwave radiation so as to increase the semiconductor structure's absorption of the microwave radiation.

2. The method of claim 1, wherein the pre-amorphization implantation is performed using a plasma doping technique.

3. The method of claim 1, wherein the pre-amorphization implantation is performed by injecting one or more implantation species into the semiconductor structure.

4. The method of claim 1, wherein the one or more implantation species include elements selected from a group consisting of: boron, phosphorus, arsenic, antinomy, germanium, silicon, helium, xenon, and argon.

5. The method of claim 1, wherein a pre-amorphization layer is formed in the semiconductor structure after the pre-amorphization implantation.

6. The method of claim 5, wherein the pre-amorphization layer includes an amorphous layer.

7. The method of claim 5, wherein the pre-amorphization layer includes defects.

8. The method of claim 5, wherein the pre-amorphization layer has a thickness in a range of approximately 5 nm to approximately 15 nm.

9. The method of claim 1, further comprising:
    forming a conductive layer on the semiconductor structure to form one or more contacts for a semiconductor device.

10. The method of claim 9, wherein parameters related to the pre-amorphization implantation are adjusted to reduce a contact resistivity associated with the one or more contacts for the semiconductor device.

11. The method of claim 1, wherein a loss tangent of the semiconductor structure is in a range of approximately 0.5 to approximately 2 after the pre-amorphization implantation.

12. The method of claim 1, wherein the microwave radiation has a frequency within a range of approximately 2 GHz to approximately 10 GHz.

13. The method of claim 1, wherein the semiconductor structure is heated to a temperature within a range of approximately 300° C. to approximately 600° C. when the microwave radiation is applied.

14. The method of claim 1, wherein the semiconductor structure is formed through epitaxial growth.

15. The method of claim 1, wherein the microwave-absorption materials are placed at a distance from the semiconductor structure.

16. The method of claim 1, wherein the one or more microwave-absorption materials are formed on the semiconductor structure.

17. The method of claim 1, wherein the microwave-absorption materials are selected from a group consisting of: boron-doped silicon germanium, silicon phosphide, titanium, nickel, silicon nitride, silicon dioxide, and silicon carbide.

18. An article for fabricating semiconductor devices, comprising:
   a substrate;
   a semiconductor structure formed on the substrate;
   a pre-amorphization layer formed in the semiconductor structure through pre-amorphization implantation, microwave-radiation absorption of the semiconductor structure being increased after the pre-amorphization implantation; and
   a microwave-absorption material layer placed at a predetermined distance from the semiconductor structure, the microwave-absorption material layer being configured to increase an electric field density associate with the semiconductor structure in response to microwave radiation,
   wherein dopants in the semiconductor structure are activated by applying microwave radiation to the semiconductor structure.

19. The article of claim 18, wherein the pre-amorphization layer includes an amorphous layer.

* * * * *